(12) United States Patent
Kang et al.

(10) Patent No.: US 8,421,211 B2
(45) Date of Patent: Apr. 16, 2013

(54) WAFER LEVEL SEMICONDUCTOR PACKAGE AND FABRICATION METHOD THEREOF

(75) Inventors: In Soo Kang, Chungcheongbuk-do (KR); Gi Jo Jung, Chungcheongbuk-do (KR); Byoung Yool Jeon, Chungcheongbuk-do (KR)

(73) Assignee: Nepes Corporation (KR)

( * ) Notice: Subject to any disclaimer, the term of this patent is extended or adjusted under 35 U.S.C. 154(b) by 87 days.

(21) Appl. No.: 12/824,190

(22) Filed: Jun. 27, 2010

(65) Prior Publication Data

US 2011/0260336 A1    Oct. 27, 2011

(30) Foreign Application Priority Data

Apr. 26, 2010 (KR) .................. 10-2010-0038710
May 7, 2010 (KR) .................. 10-2010-0042703

(51) Int. Cl.
  *H01L 23/16* (2006.01)
  *H01L 25/065* (2006.01)
  *H01L 23/562* (2006.01)

(52) U.S. Cl.
USPC ........... 257/693; 257/698; 257/700; 257/725; 257/738; 257/777; 257/778; 257/780; 257/787; 257/724

(58) Field of Classification Search .................. 257/777, 257/788, E23.169, 686, E23.023
See application file for complete search history.

(56) References Cited

U.S. PATENT DOCUMENTS

| 7,176,043 B2* | 2/2007 | Haba et al. ...................... 438/14 |
| 2006/0192287 A1* | 8/2006 | Ogawa et al. ................. 257/758 |
| 2007/0095471 A1* | 5/2007 | Ito et al. ........................ 156/293 |
| 2008/0136004 A1* | 6/2008 | Yang et al. .................... 257/686 |

* cited by examiner

*Primary Examiner* — Olik Chaudhuri
*Assistant Examiner* — Wilner Jean Baptiste

(57) ABSTRACT

A wafer level semiconductor package is provided. A warpage control barrier line formed in every package of a single wafer prevents wafer from warping. The changed shape of the interface between a semiconductor chip and a molding layer at the edge of the package disperses stress applied to the outside of the package, and suppress the generation and propagation of crack. The size of the package is reduced to that of the semiconductor, and the thickness of the package is minimized.

13 Claims, 15 Drawing Sheets

WAFER LEVEL SEMICONDUCTOR PACKAGE AND FABRICATION METHOD THEREOF

BACKGROUND

1. Technical Field

The present invention relates to a wafer level semiconductor package, and more particularly, to a new semiconductor package with small size and enhanced durability.

2. Discussion of the Related Art

In a wafer level packaging process, a wafer with integrated circuit deposited therein or chips mounted thereon undergoes a series process, such as die-bonding, molding, marking and so on, and is finally cut into finished products. Wafer level packaging process has been considered as suitable technology for small sized and high speed package.

Especially, chip-size package realized in wafer level process enables a single memory module to have much more chips mounted thereon, so as to easily fabricate a mass storage memory module.

Moreover, a semiconductor device fabricated with wafer level packaging technology has enhanced electrical property and good heat radiation because of short length to an outer connection part (ex. an outer bump). Thus, wafer level packaging technology can improve remarkably the quality and reliability of a semiconductor device.

Referring to FIG. 1, a plurality of active areas (110) with integrated circuit thereon is arranged apart from each other in the surface of a semiconductor wafer (100). In wafer level semiconductor packaging process, every packaging step is processed on a wafer with uncut active areas, and the wafer is cut into single packages in final step. The active areas (110) may include thin film elements, such as transistor, metal pattern, or passive device, and additional semiconductor chip mounted thereon. In this case, the wafer functions as a base substrate (or support body) for packaging a semiconductor chip. After a semiconductor chip (not shown) is mounted on the wafer by flip-chip bumping or die-attach, a molding layer (300) is formed on the chip all over the wafer, as shown in FIG. 2. In this manner, forming a large sized molding layer at a wafer level enables a semiconductor packaging process to be more effective.

However, large sized molding layer formed at a wafer level is inevitably under stress due to a difference of CTE (coefficient of thermal expansion) or Young's modulus between the wafer and the molding layer. FIG. 3 shows schematically the stress generated in molding layer. The stress creates a compressive force in the direction to the center from the outside (direction of the arrow). Resultantly, concave type warpage is generated in the wafer as shown in FIG. 4.

The warpage of a wafer brings about compatibility problem in using the equipments for packaging process, and thus the following process such as grinding or testing is impossible. Warpage issue is serious especially in a large sized wafer, and has raised an obstacle to a wafer level semiconductor packaging process.

Accordingly, in order to guarantee the process reliability of wafer level packaging technology and fabricate durable semiconductor packages, there is many problems to be solved. Especially, a new technology of wafer level molding process is required for reducing the warpage of a wafer.

As another issue in a semiconductor package with semiconductor chips stacked therein, the contact area between different materials, for example between a semiconductor chip and a molding layer, has poor resistance to stress. In particular, crack or flaking due to thermal and mechanical stress is concentrated on the outside or corner of a package. The crack or flaking decreases physical durability of a package, and becomes more serious as the size of a package gets smaller.

Therefore, the present invention is directed to provide a new semiconductor package with reduced crack and flaking at the interface between a different material in a package to improve reliability.

Another object of the present invention is to provide a light, thin, short and small chip-sized package fabricated in a wafer level process.

Still another object of the present invention is to reduce a warpage of a wafer in a wafer level process, and is to provide with a semiconductor package with enhanced reliability.

SUMMARY

In accordance with an aspect of the present invention, the present invention provides a semiconductor package, comprising: a first semiconductor chip with a first conductive redistribution layer thereon; a second semiconductor chip with smaller size than the first semiconductor chip, said second semiconductor chip being formed above the first semiconductor chip; a molding layer formed on the first semiconductor chip and around the second semiconductor chip; conductive posts electrically connected to the first conductive redistribution layer, said conductive post penetrating the molding layer; a warpage control barrier line on the first semiconductor chip, said warpage control barrier line being arranged at the outside of the second semiconductor chip; a second conductive redistribution layer formed on the molding layer and electrically connected to the conductive posts; and an outer connecting part electrically connected to the second conductive redistribution layer, wherein the warpage control barrier line and the molding layer have different modulus of elasticity with each other.

In accordance with another aspect of the present invention, the present invention provides a semiconductor package, comprising: a first semiconductor chip with a first conductive redistribution layer thereon; a second semiconductor chip with smaller size than the first semiconductor chip, said second semiconductor chip being formed above the first semiconductor chip; a molding layer formed on the first semiconductor chip and around the second semiconductor chip; conductive posts electrically connected to the first conductive redistribution layer, said conductive post penetrating the molding layer; a second conductive redistribution layer formed on the molding layer and electrically connected to the conductive posts; and an outer connecting part electrically connected to the second conductive redistribution layer, wherein the interface between the first semiconductor chip and the molding layer is enlarged at the edge of the first semiconductor chip.

According to the present invention, the stress concentrated in the outer interface between a semiconductor chip and a molding layer in a package is dispersed at the contact edge to reduce poor contact and defect in the edge and corner of a semiconductor package. As a result, a light, thin, short and small semiconductor package with excellent durability can be realized. Especially, in a wafer level process, a plurality of packages is fabricated without a warpage of a wafer.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE PREFERRED EMBODIMENTS

The present invention will now be described more fully hereinafter with reference to the accompanying drawings, in which preferred embodiments of the invention are shown.

The present invention provides a wafer level semiconductor package, especially for system-in-package, with a warpage control barrier line or with stepped structure along the scribe lane of a base chip.

Figure 5:
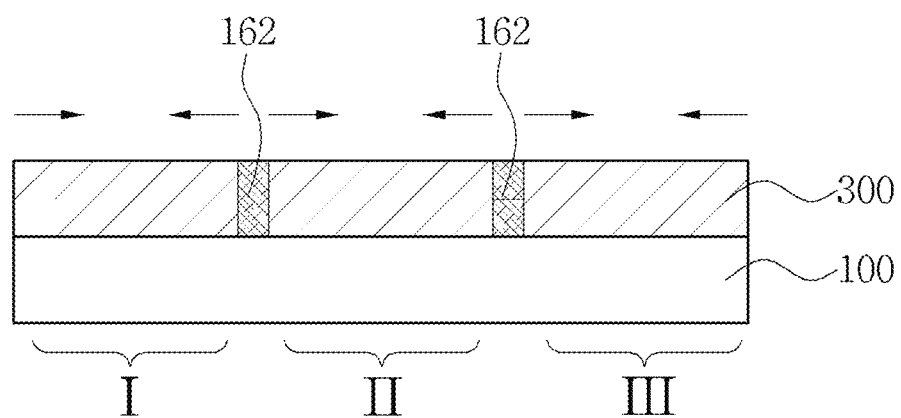
FIG. 5 is a sectional view of the wafer with a warpage control barrier line according to the present invention.

FIG. 5 shows a sectional view of a part of the wafer level semiconductor package with a warpage control barrier line according to the present invention. The wafer (100) may have a semiconductor chip or a thin film device on its surface. A warpage control barrier line (162) is formed in molding layer (300) on the top surface of the wafer.

The warpage control barrier line (162) partitions the molding layer (300) on the wafer into a lot of regions (I, II, III) and the molding layers in the regions are isolated, respectively. Each molding part divided by the warpage control barrier line has independent stress generated in the direction to the center from the outside (direction of the arrow in FIG. 5). Resultantly, concave type warpage is generated in each molding part.

Division of molding layer generates tensile stress around the warpage control barrier line, and results in reverse warpage to all over the wafer. In the whole of molding layer, compressive force and tensile force are simultaneously generated, which reduces total stress in the wafer and remarkably decreases the warpage of the wafer.

The warpage control barrier line (162) is formed using different material from the molding layer. Material for the warpage control barrier line (162) with large difference of Young's modulus from that of the molding layer is preferable to counterbalance the stress in the molding layer and to control the generation of warpage.

Figure 6:
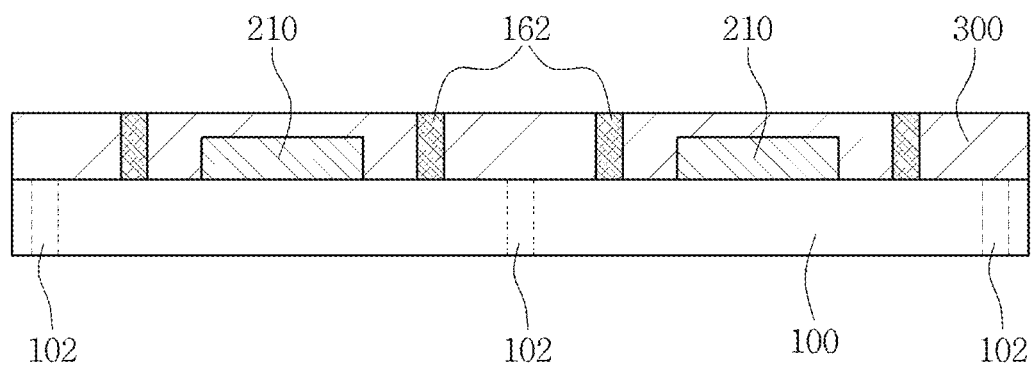
FIG. 6 and FIG. 7 are a plan view and a sectional view of the wafer level semiconductor package according to one embodiment of the present invention.
Figure 7:
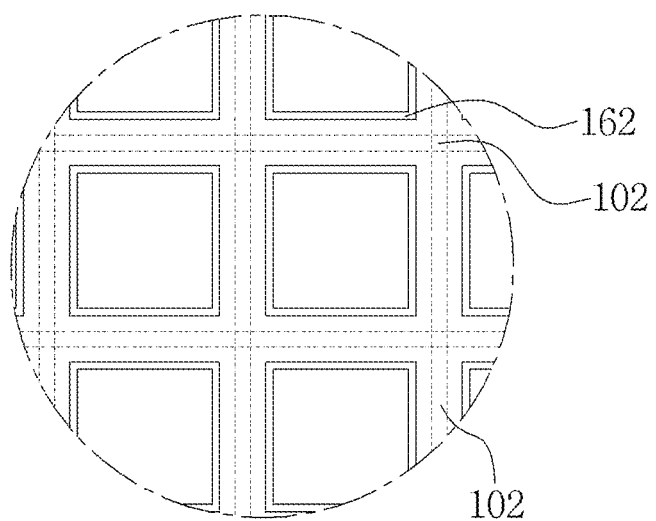
Figure 8:
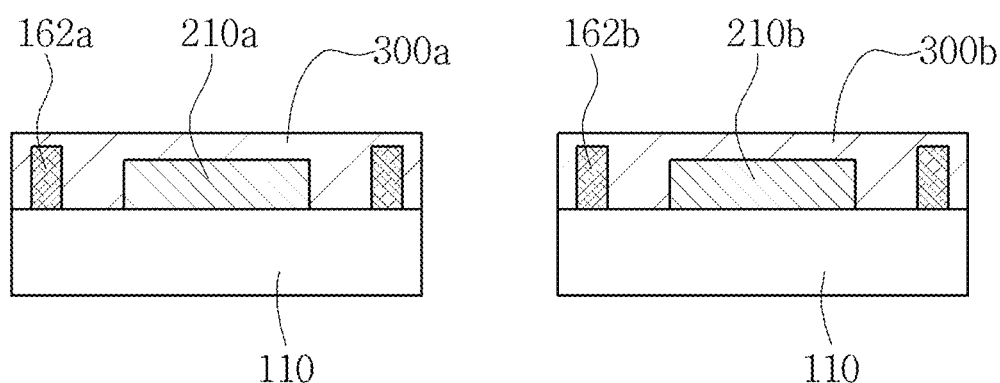
FIG. 8 is a sectional view of a single semiconductor package with a warpage control barrier line.

FIG. 6 shows a sectional view of a wafer level semiconductor package according to one embodiment of the present invention. A lot of semiconductor chips (or integrated circuit units) (210) are mounted on the surface of the wafer. The warpage control barrier line (162) is formed at near scribe lane (102) around single semiconductor chip (or integrated circuit unit). In FIG. 7, the warpage control barrier line (162) is shown to be formed continuously around single chip or several chips. In the present invention, the thickness, width, and height of the warpage control barrier line may be varied depending on the size of semiconductor chip or integrated circuit units in a semiconductor package, or the thickness of the molding layer. When the packaging process is finished after sawing the wafer into single package, the warpage control barrier line (162a, 162b) remains in the molding layer (300a, 300b) of the divided single package. The warpage control barrier line (162a, 162b) prevents any following stress in the molding layer so as to improve reliability of the semiconductor package.

The warpage control barrier line (162a, 162b) is formed using a dielectric material, a photoresist, or an adhesive tape. In some other case, metal such as Cu or Al is used for forming the warpage control barrier line.

If the warpage control barrier line is made of metal, packaging process may be advantageously simplified since the warpage control barrier line can be formed at a step for forming a conductive structure around a semiconductor chip, without any further process for the warpage control barrier line.

In a wafer level semiconductor package according to the present invention, warpage control barrier layer may be additionally formed on the wafer, together with the warpage control barrier line.

Figure 9:
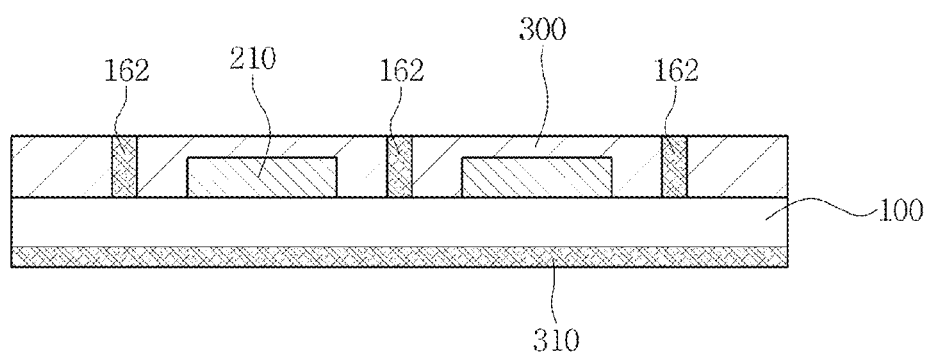
FIG. 9 is a sectional view of a semiconductor package according to another embodiment of the present invention.

FIG. 9 shows a thin film or thick film of warpage control barrier layer (310) formed on the bottom surface of the wafer (100). The warpage control barrier layer (310) may be made of same material as or different material from the warpage control barrier line.

The warpage control barrier layer (310) may be formed in a single continuous layer, or in a pattern same as or similar to the warpage control barrier line. The warpage control barrier layer (310) can generates the same compressive force as the stress in the molding layer (310) so as to counterbalance warpage created in the wafer, and can disperse the stress in the molding layer like the warpage control barrier line so as to reduce the generation of warpage of the wafer.

The warpage control barrier layer (310) may be eliminated during the packaging process, or remain on the wafer as a part of a package.

Figure 10:
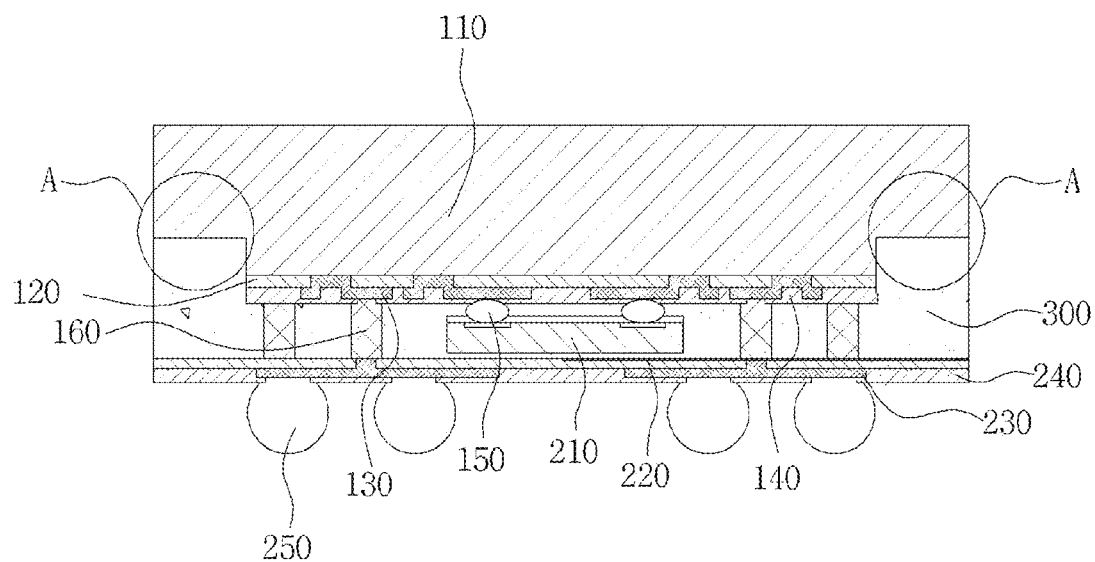
FIG. 10 is a sectional view of a semiconductor package according to another embodiment of the present invention.

FIG. 10 shows a sectional view of a wafer level semiconductor package according to another embodiment of the present invention. The package includes a first semiconductor chip (110) as a base chip and a second semiconductor chip (210) stacked on and electrically connected to the first semiconductor chip. The top surfaces of the first semiconductor chip (110) and the second semiconductor chip (210) face to each other (in a face-to-face type) and bumps (150) electrically connect the two chips. Differently from FIG. 10, in a semiconductor package according to the present invention, the bottom surface of the second semiconductor chip faces to the top surface of the first semiconductor chip. In this case, the second semiconductor chip may be mounted by die attach on the first semiconductor chip.

A first dielectric layer (120) and a second dielectric layer (140) are formed on the first semiconductor chip. A first conductive redistribution layer (130) is formed between the first dielectric layer (120) and the second dielectric layer (140). The first conductive redistribution layer (130) functions as a metal wiring for electrically connecting the bump (150) and the first semiconductor chip (110), and also connects the first semiconductor chip (110) to an outer connecting part via a conductive post (160). In a step for forming the first conductive redistribution layer (130), a thin film passive device (not shown) may be formed together between the first dielectric layer (120) and the second dielectric layer (140). Such a passive device, together with a first semiconductor chip and a second semiconductor chip, constitutes system-in package.

A molding layer (300) formed between first semiconductor chip (110) and the second semiconductor chip (210) protects integrated circuits and metal wiring patterns of the chips, and also constitutes a single physical body together with the semiconductor chip (110, 210). The molding layer (300) has the same size as the first semiconductor chip (110), and consequently the total size of the package is limited to the size of the first semiconductor chip. Accordingly, chip-size package is realized.

The molding layer (300) covers completely the second semiconductor chip (210), and is in horizontal contact with (or in parallel with) the most part of the top surface of the first semiconductor chip (110). On the other hand, the edge (A) of the first semiconductor chip is partly cut off, and the interface (contact area) between the molding layer (300) and the first semiconductor chip (110) at the edge is enlarged comparing to other part. In this embodiment, the first semiconductor chip has a stepped structure along its edge. In the stepped part (A), the molding layer goes forward to the first semiconductor chip. The stepped part of the first semiconductor chip is filled up correspondingly with molding layer. Consequently, the whole package has a rectangular form in a sectional view and a hexahedral form in a three dimensional view.

The stepped structure at the edge of the first semiconductor chip (110) shifts the position of the interface between the molding layer and the first semiconductor chip. That is, the interface at the edge is moved deeper to the inside of the chip (110) than other layers on the first semiconductor chip (such as a first conductive redistribution layer).

In this manner, increasing the contact area between the first semiconductor chip and the molding layer (which are exposed to the exterior) leads to enhancement of mechanical strength and durability against external impact of a semiconductor package. Further, changing partly the position of the interface between the first semiconductor chip and the molding layer improves resistance against crack generation and crack propagation in a semiconductor package. Especially, without using another substrate for packaging or without change of the shape of a molding layer, a light, thin, short, and small semiconductor package can be realized.

As described below, the stepped edge (A) of the first semiconductor chip (110) may have different shape, such as double stepped structure, tilted structure, and so on, in order to increase the area of the interface between the first semiconductor chip and the molding layer.

A third dielectric layer (220) and a fourth dielectric layer (240) are formed on the molding layer (300). A second conductive redistribution layer (230) is formed between the third dielectric layer (220) and the fourth dielectric layer (240). The second conductive redistribution layer (230) is electrically connected to the conductive post (160). A part of the second conductive redistribution layer (230) is exposed at the fourth dielectric layer (240) and is also electrically connected to an outer connecting part (250).

A plurality of the outer connecting parts (250) connected to the second conductive redistribution layer (230) are formed, in fan-out type arrangement, around the second semiconductor chip (210). The molding layer (300) may completely cover the second semiconductor chip (210) or cover around the second semiconductor chip to expose a surface of the second semiconductor chip. In this case, the third dielectric layer (220) and the fourth dielectric layer (240) are preferable to be removed from the exposed surface of the second semiconductor chip.

The semiconductor package in accordance with the present embodiment can realize a very thin and small sized package, since the first semiconductor chip corresponding to a base chip functions as a substrate and thus there is no need of additional substrate for a package. Moreover, short length of metallization (or wiring metal pattern) for the first semiconductor chip and the second semiconductor chip enables high speed signal transmission.

The fabrication process according to a preferable embodiment of the present invention will now be described hereinafter.

Figure 1:
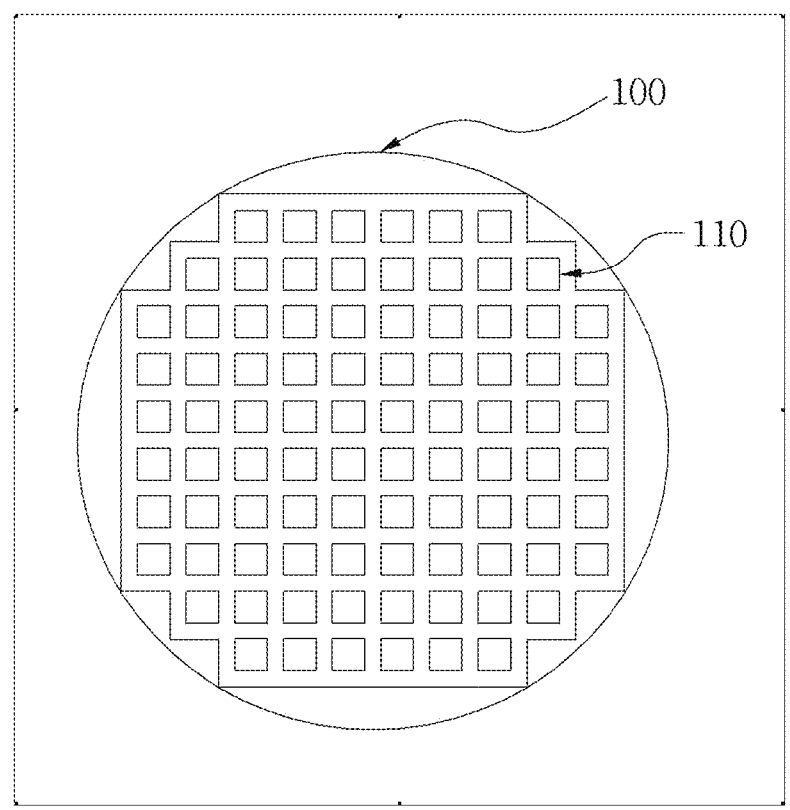
FIG. 1 is a plan view of a wafer level semiconductor package.
Figure 2:
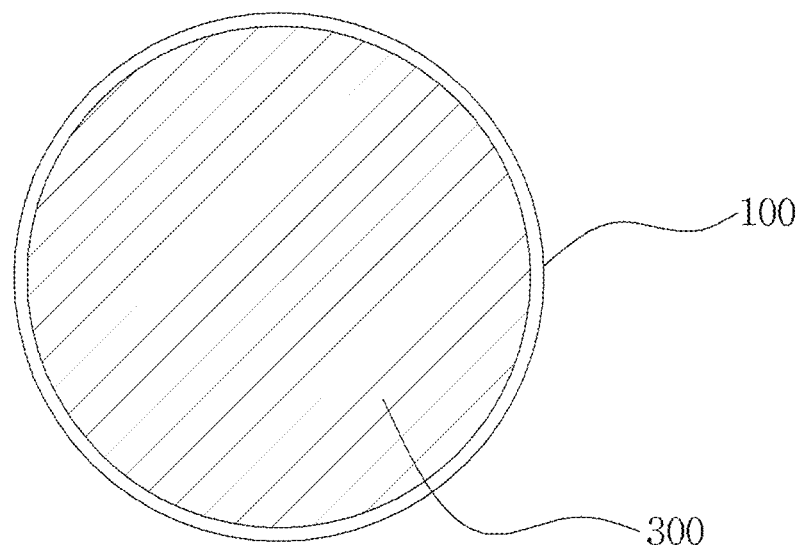
FIG. 2 is a plan view of a wafer level semiconductor package with molding layer.
Figure 3:
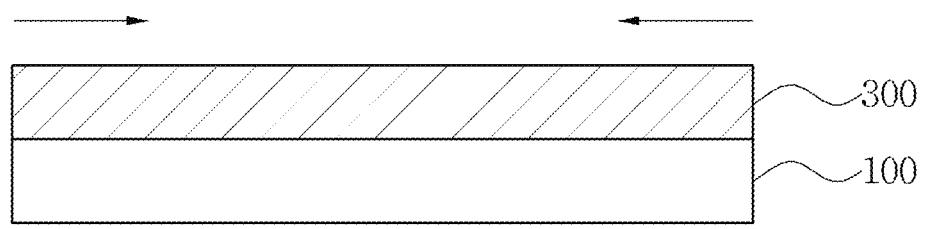
FIG. 3 is a schematic sectional view of stress generated in molding layer.
Figure 4:
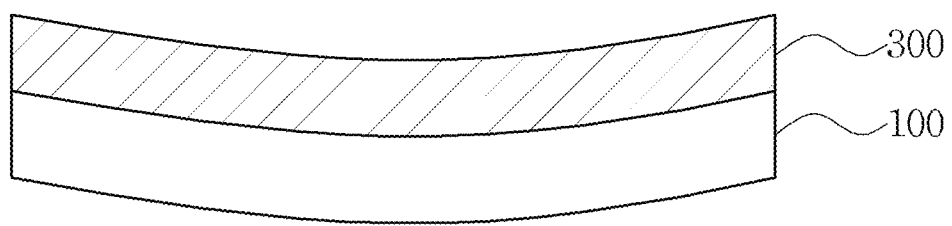
FIG. 4 is a schematic sectional view of wafer warpage due to stress in molding layer.
Figure 11:
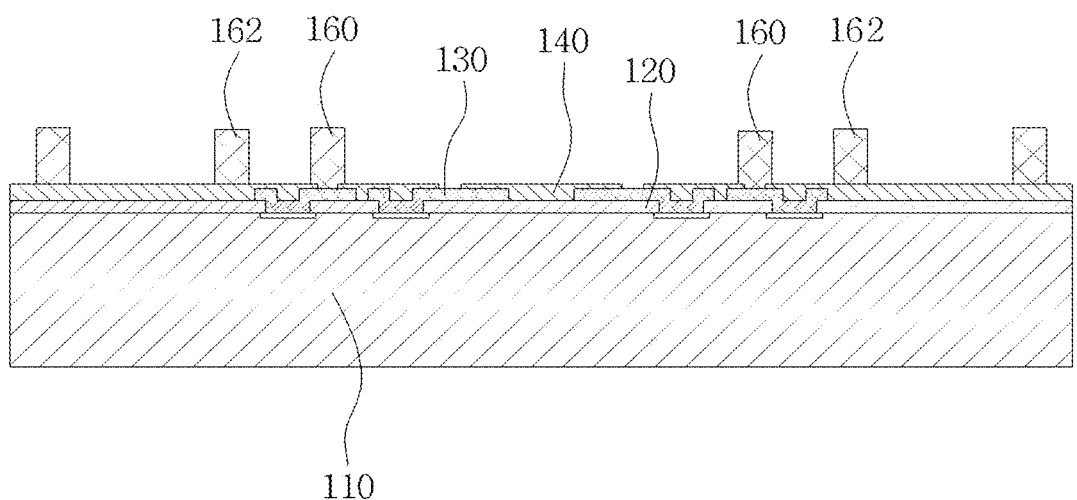
FIGS. 11 to 19 are sectional views showing steps of the fabrication process of a wafer level semiconductor package according to the present invention.

A wafer with a plurality of first semiconductor chips (110) being formed thereon is prepared, as shown in FIG. 1. A first dielectric layer (120) is formed on the top surface of the first semiconductor chip, and a first conductive redistribution layer (130) is formed on the first dielectric layer. A second dielectric layer (140) is formed on the first conductive redistribution layer which partly exposes the second dielectric layer. In wafer level process, a conductive post (160) is formed on the first semiconductor chip (110) as illustrated in FIG. 11. The conductive post (160) is electrically connected to the first conductive redistribution layer. The conductive post may be, for example, a metal bump and functions as an electrical path for the first semiconductor chip (110). A plurality of conductive posts may be formed on the first semiconductor chip. The process such as photoresist or etching for forming the conductive post is readily understood by those skilled in the art, and thus it will be not described in detail here.

Figure 12:
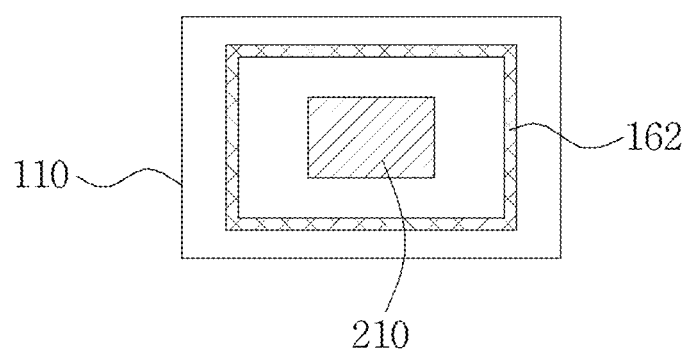
Figure 13:
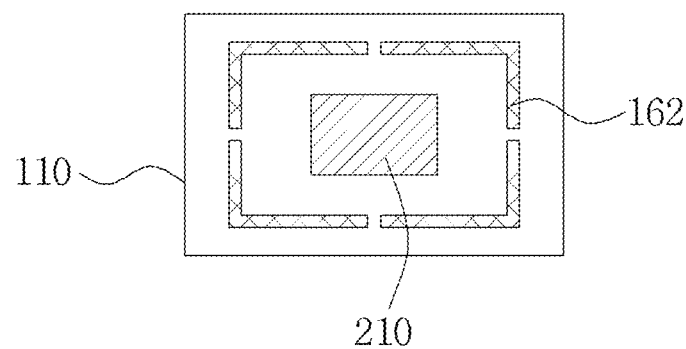

In forming the conductive post (160), a warpage control barrier line (162) can be also formed simultaneously or sequentially. The warpage control barrier line (162) may be formed in a continuous ring or loop (FIG. 12) or in a discontinuous ring or loop (FIG. 13) in order to surround an integrated circuit on the first semiconductor chip (110). When a molding layer is formed on a large sized wafer, the warpage control barrier line (162) can scatter stress generated in the interface between a wafer and a molding layer and function as a dam for dividing the molding layer into individual mold cover for a single package in order to reduce a wafer warpage.

To minimize a warpage of a wafer, the shape of the warpage control barrier line (162) can be varied with the size of a chip mounted on a wafer, the kind of molding material, or the shape of other thin film elements in a package.

Figure 14:
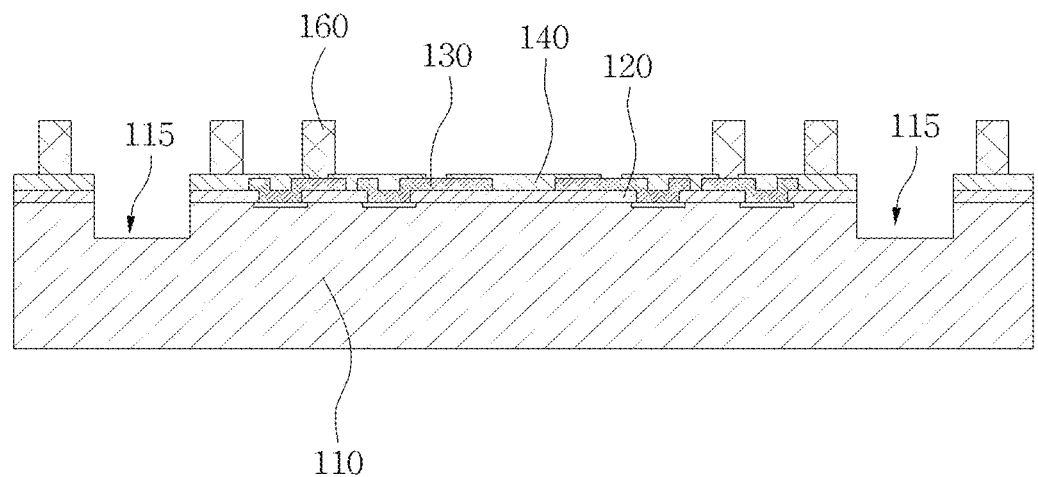

Next, a groove (115) is formed at the periphery of the unit area in wafer (that is, a first semiconductor chip (110)) (FIG. 14). The groove has a moat form around the first semiconductor chip, and is in a cross strips or check pattern on the whole wafer. The groove is formed at a scribe lane (cutting line) of a wafer by sawing or etching.

Figure 15:
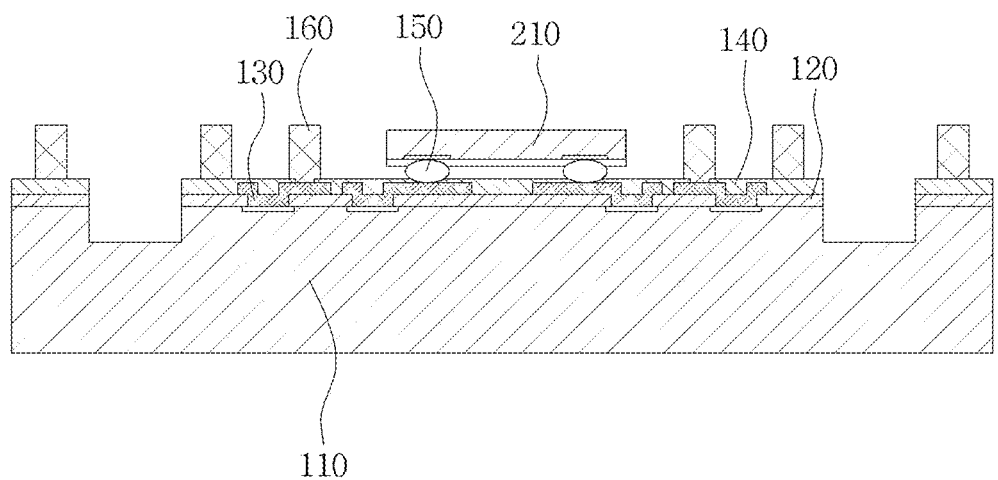

Next, in a continuous wafer level process, a second semiconductor chip (210) is mounted above the first semiconductor chip (110) (FIG. 15). The second semiconductor chip (210) has smaller size than the first semiconductor chip (110), and is electrically connected via bump (150) to the first conductive redistribution layer (130) on the first semiconductor chip (110). The second semiconductor chip may be mounted before forming the groove.

Figure 16:
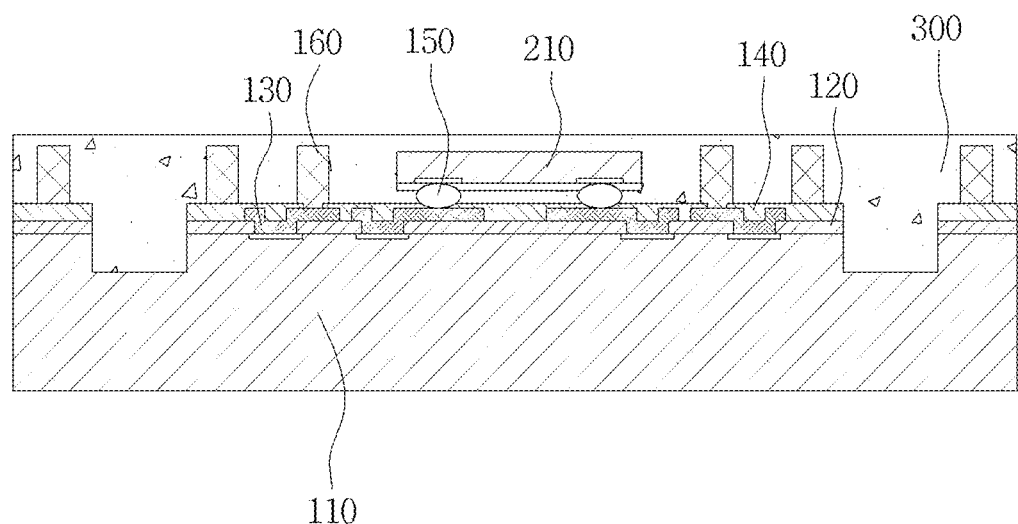
Figure 17:
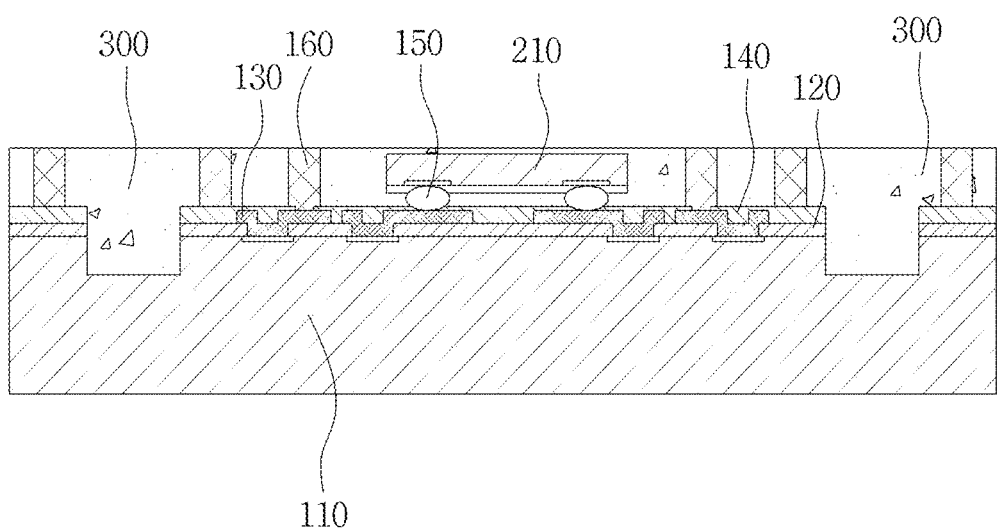

After mounting the second semiconductor chip, a molding layer (300) is formed on the first semiconductor chip in a wafer level process (FIG. 16). The molding layer fills up the groove (115) completely, and cover the second semiconductor chip (210) totally, and then, the upper part of the molding layer is grinded to expose the top surface of the conductive post (160) (FIG. 17). In this grinding process, the warpage control barrier line (162) or second semiconductor chip (210) may also be exposed from the molding layer. After or before grinding the molding layer, the bottom surface of the first semiconductor chip (110) may be grinded to be thinned.

Figure 18:
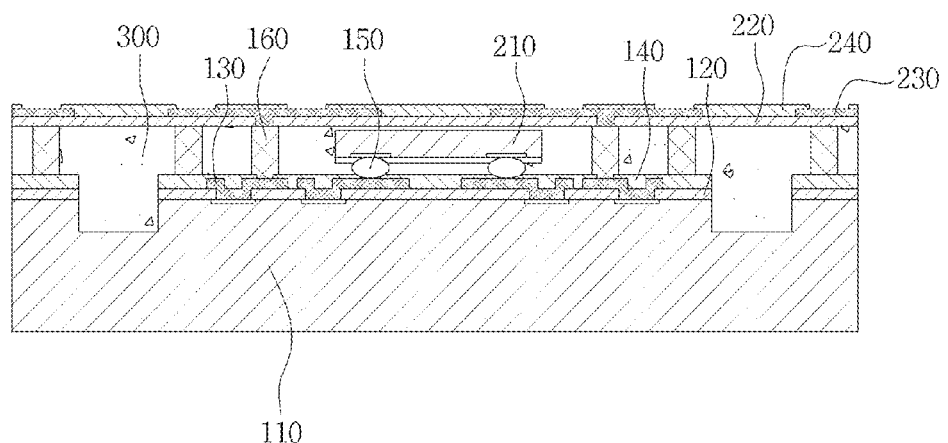

Next, in a wafer level process, a third dielectric layer (220), a second conductive redistribution layer (230), and a fourth dielectric layer (240) are formed in sequence on the molding layer (300) (FIG. 18). The second conductive redistribution layer (230) is patternized to be electrically connected to the conductive post (160). If necessary, the third dielectric layer (220), the second conductive redistribution layer (230) and the fourth dielectric layer (240) on the second semiconductor chip (210) may be removed to exposure the top surface of the second semiconductor chip. After forming the second conductive redistribution layer, the individual package in wafer level may be tested for selecting good dies.

Figure 19:
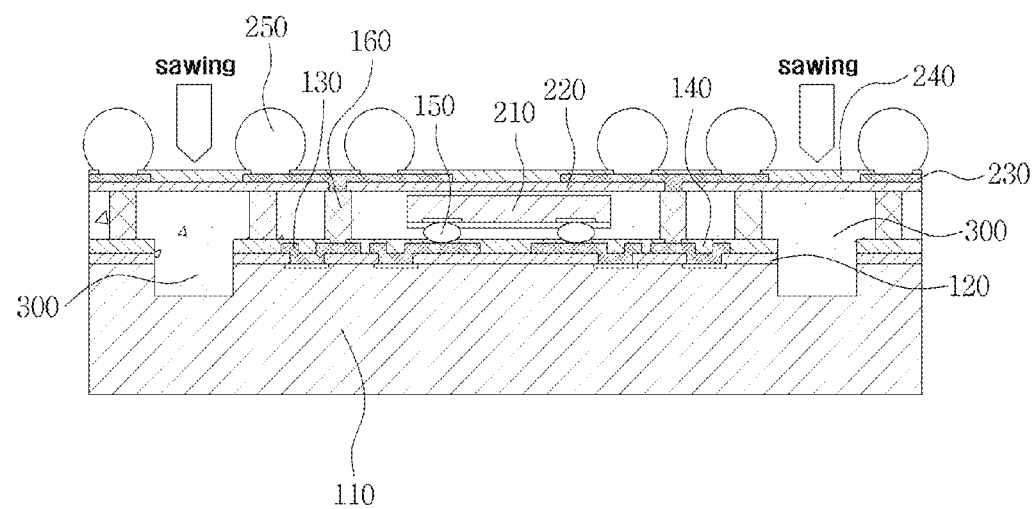

Finally, an outer connecting part (250) is formed in a wafer level to be electrically connected to the second conductive redistribution layer (230), and then the wafer is cut off into individual packages along the scribe lane (at which the groove is formed) (FIG. 19). The finished single package has the same shape as one in the embodiment as shown in FIG. 10. The outer part of the contact area between the first semiconductor chip and the molding layer has a stepped structure, which scatters stress concentrated in the edge of the package and thus reduces the poor contact between the chip and the molding layer.

The bottom surface of the first semiconductor chip (110) (corresponding to a base substrate) is exposed to be easy for heat radiation and for combining a heat spreader.

Through the wafer level process in the above, a light, thin, short and small semiconductor package with excellent durability can be fabricated.

Figure 20:
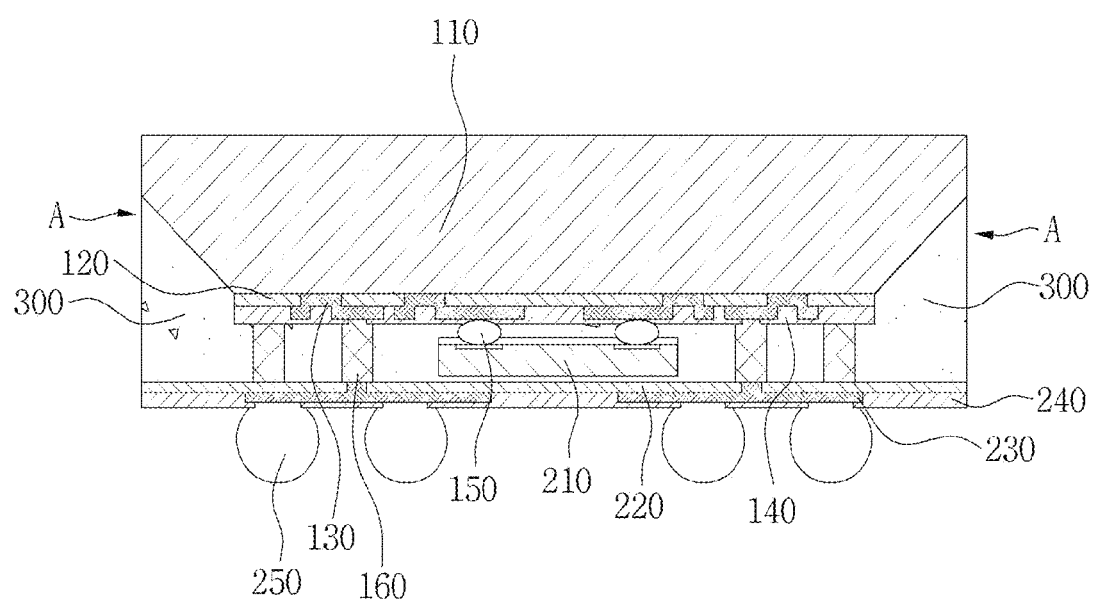
FIG. 20 is a sectional view of a semiconductor package according to another embodiment of the present invention.

FIG. 20 shows a semiconductor package in accordance with another embodiment of the present invention. In the package, the interface between the first semiconductor chip (110) and the molding layer (300) has tilt structure at the edge (A), unlike the previous embodiment. The tilted structure at the edge (A) can be realized by forming the groove (115) in an inclined slit or trench shape during the process as shown in FIG. 14. In this case, the contact area between the first semiconductor chip and the molding layer is increased and the contact position at the edge of the package is changed, and thus the package has an enhanced durability.

Figure 21:
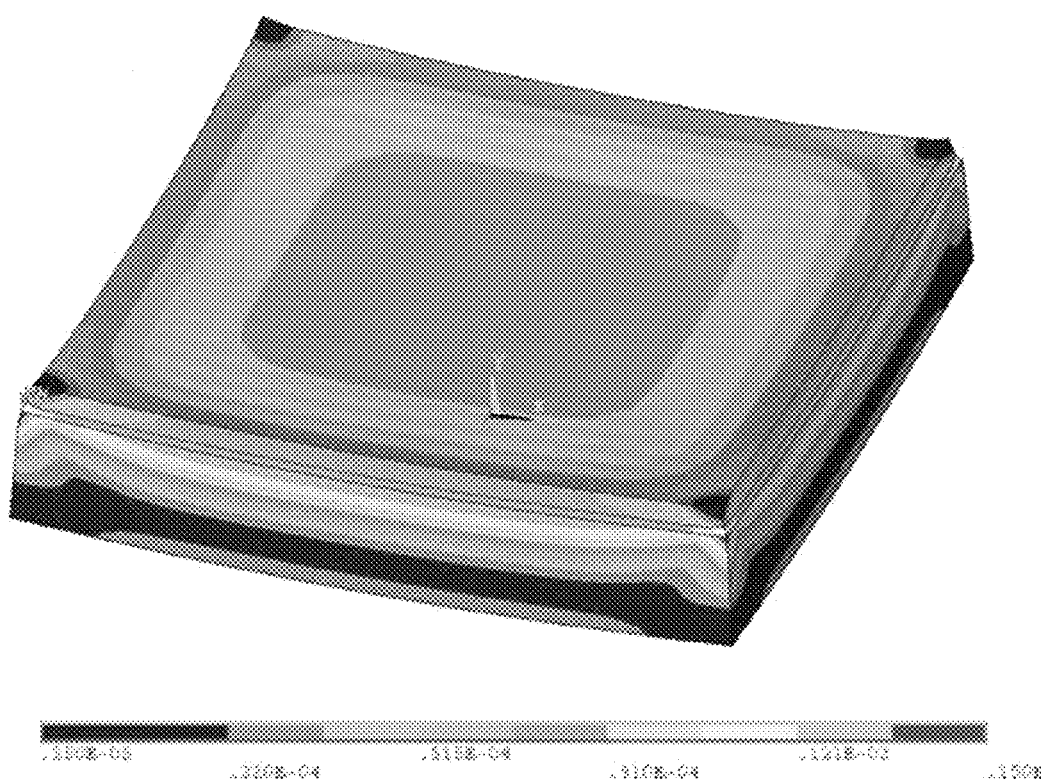
FIG. 21 is a graphic image showing stress distribution of a semiconductor package.
Figure 22:
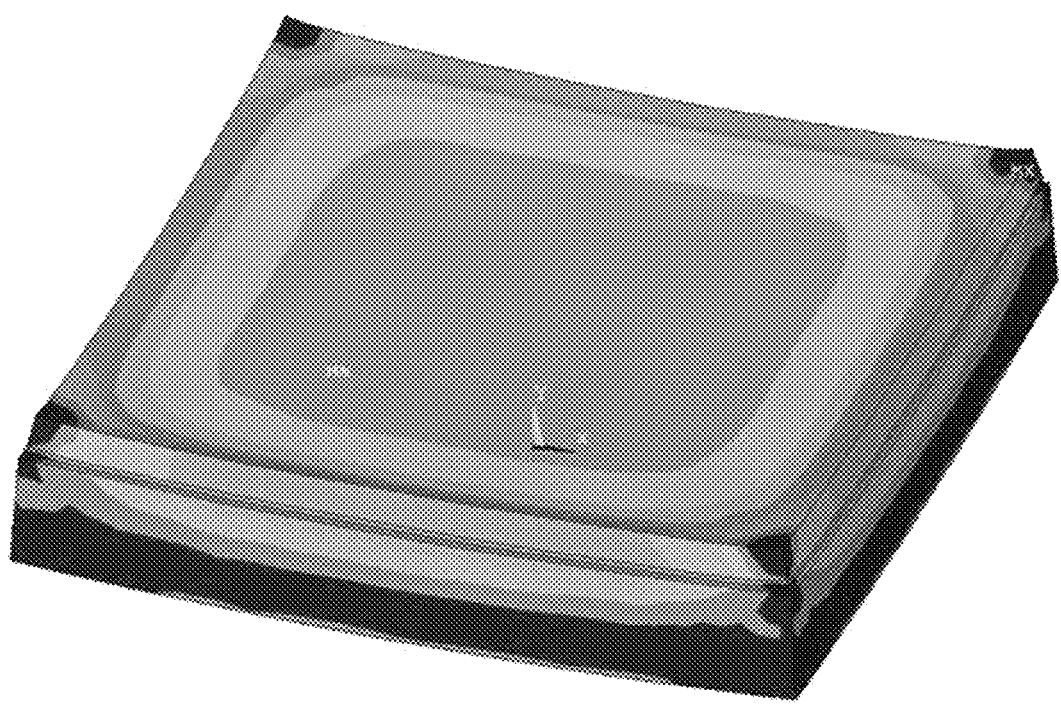
FIG. 22 is a graphic image showing stress distribution of a semiconductor package according to an embodiment of the present invention.
Figure 23:
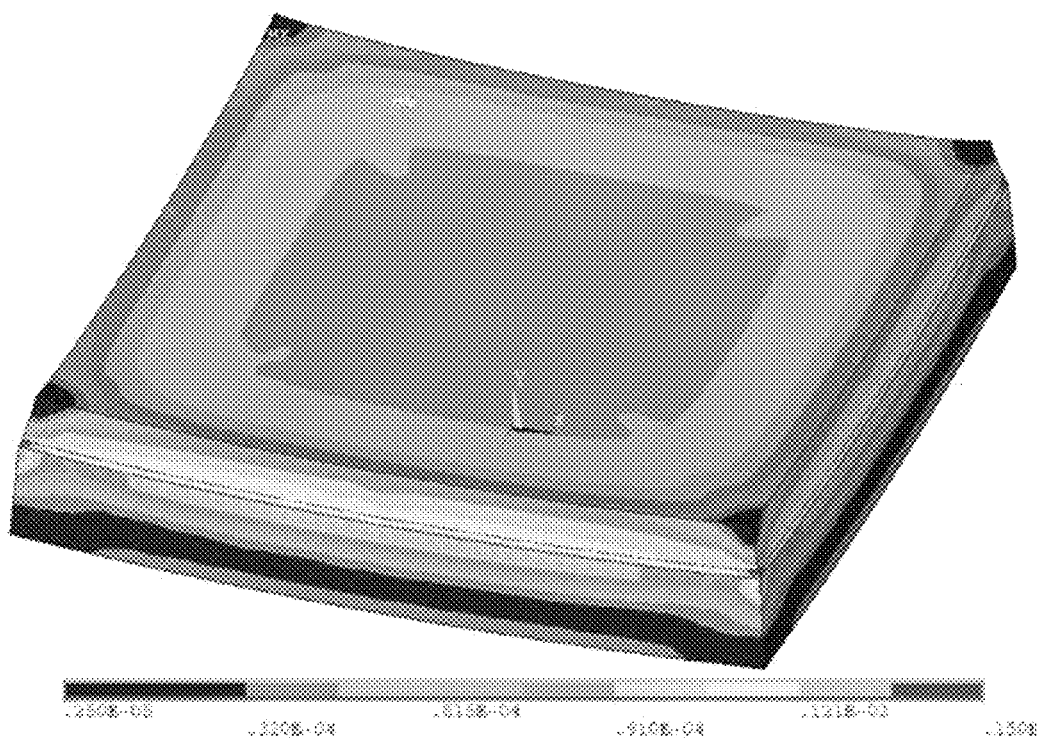
FIG. 23 is a graphic image showing stress distribution of a semiconductor package according to another embodiment of the present invention.

FIGS. 21 to 23 are graphic image showing simulation test for the durability of a semiconductor according to the present invention. FIG. 21 shows the stress distribution test of a package with no change of interface between a first semiconductor chip and a molding layer, FIG. 22 shows the test of the package according to the embodiment related FIG. 10, and FIG. 23 shows the test of the package related FIG. 20.

From the test, the packages according to the present invention have good stress distribution and reduced stress at the edge of the interface between a chip and a molding layer, resultantly showing an excellent durability.

The invention has been described using preferred exemplary embodiments. However, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

What is claimed is:

1. A semiconductor package, comprising:
    a first semiconductor chip with a first conductive redistribution layer directly formed thereon;
    a second semiconductor chip with a smaller size than the first semiconductor chip, said second semiconductor chip mounted on the first semiconductor chip;
    a molding layer formed directly on the first semiconductor chip and around the second semiconductor chip;
    a plurality of conductive posts electrically connected to the first conductive redistribution layer, said conductive posts penetrating the molding layer;
    a warpage control barrier line directly formed on the first semiconductor chip, said warpage control barrier line being arranged at the outside of the second semiconductor chip, a second conductive redistribution layer formed on the molding layer and electrically connected to the conductive posts; and
    an outer connecting part electrically connected to the second conductive redistribution layer,
    wherein the warpage control barrier line and the molding layer have different Young's modulus with each other,
    wherein the warpage control barrier line takes the shape of a continuous ring.

2. The semiconductor package of claim 1, wherein the warpage control barrier line is a metal line.

3. The semiconductor package of claim 1, further comprising a warpage control barrier layer formed on a bottom surface of the first semiconductor chip.

4. The semiconductor package of claim 1, wherein the warpage control barrier line is arranged near or at an edge of the first semiconductor chip.

5. The semiconductor package of claim 1, wherein the warpage control barrier line takes the shape of a discontinuous ring.

6. The semiconductor package of claim 1, wherein the interface between the first semiconductor chip and the molding layer is enlarged at an edge of the first semiconductor chip.

7. The semiconductor package of claim 6, wherein the interface between the first semiconductor chip and the molding layer at the edge of the first semiconductor chip is lower than a top surface of the first semiconductor chip.

8. The semiconductor package of claim 6, wherein the top surfaces of the first semiconductor chip and the second semiconductor chip face each other, and the first semiconductor chip and the second semiconductor chip are electrically connected to each other via a bump.

9. The semiconductor package of claim 6, wherein the bottom surface of the second semiconductor chip is mounted by a die attach process above the top surface of the first semiconductor chip.

10. The semiconductor package of claim 6, wherein a surface of the second semiconductor chip is exposed to an exterior of the package.

11. The semiconductor package of claim 6, further comprising a thin film passive device formed between the first semiconductor chip and the second semiconductor chip.

12. The semiconductor package of claim 6, wherein the edge of the first semiconductor chip has a stepped part, and the stepped part is filled with a molding compound.

13. The semiconductor package of claim 6, wherein the edge of the first semiconductor chip has a tilted part, and the tilted part is filled with a molding compound.

* * * * *